(12) United States Patent
Kim

(10) Patent No.: US 12,294,382 B2
(45) Date of Patent: May 6, 2025

(54) SINGLE SLOPE ANALOGUE TO DIGITAL CONVERTER AND OPERATING METHOD THEREOF

(71) Applicant: KNU-Industry Cooperation Foundation, Chuncheon-si (KR)

(72) Inventor: Hyeon Joon Kim, Samcheok-si (KR)

(73) Assignee: KNU-INDUSTRY COOPERATION FOUNDATION, Chuncheon-si (KR)

( * ) Notice: Subject to any disclaimer, the term of this patent is extended or adjusted under 35 U.S.C. 154(b) by 177 days.

(21) Appl. No.: 18/161,276

(22) Filed: Jan. 30, 2023

(65) Prior Publication Data

US 2024/0259032 A1    Aug. 1, 2024

(51) Int. Cl.
*H03M 1/56* (2006.01)
*H03M 1/12* (2006.01)
*H03M 1/06* (2006.01)
*H03M 1/08* (2006.01)

(52) U.S. Cl.
CPC ............. *H03M 1/56* (2013.01); *H03M 1/125* (2013.01); *H03M 1/0675* (2013.01); *H03M 1/0836* (2013.01)

(58) Field of Classification Search
CPC ...... H03M 1/56; H03M 1/125; H03M 1/0675; H03M 1/0836
See application file for complete search history.

(56) References Cited

U.S. PATENT DOCUMENTS 10,205,463 B1 *  2/2019  Milkov ............... H03M 1/1295

* cited by examiner

*Primary Examiner* — Joseph J Lauture
(74) *Attorney, Agent, or Firm* — Sughrue Mion, PLLC

(57) ABSTRACT

Disclosed herein is a method of operating a single slope analog-to-digital converter (ADC), which includes receiving an input signal from a sensor or a ramp signal from a ramp generator according to a state of a switch and sampling the received input or ramp signal, comparing, by a comparator, whether the sampled ramp signal is present in a predetermined input range in a state in which the ramp generator maintains an off state and outputting the comparison result, generating, by a logic part, a flag signal indicating a high or low according to the comparison result by the comparator and providing the flag signal to the ramp generator, and sampling, by the ramp generator, a reference voltage of the comparator according to the flag signal based on an off or on state.

10 Claims, 15 Drawing Sheets

SINGLE SLOPE ANALOGUE TO DIGITAL CONVERTER AND OPERATING METHOD THEREOF

CROSS-REFERENCE TO RELATED APPLICATION

This application claims priority to and the benefit of Korean Patent Application No. 2023-0011479, filed on Jan. 30, 2023, the disclosure of which is incorporated herein by reference in its entirety.

BACKGROUND

1. Field of the Invention

The present disclosure relates to a single slope analog-to-digital converter (ADC) and an operating method thereof, and more particularly, to a single slope ADC capable of accepting an input signal range twice as large as that of the related art and being applied to actual products with simplified logic, and an operating method thereof.

2. Discussion of Related Art

Currently, Internet of things (IoT) systems are being developed worldwide due to the fourth industrial revolution, and the market for application and derivative industries of the IoT systems is continuously expanding. Most of these IoT systems necessarily include analog-to-digital converters (ADCs) for converting analog data into a digital code.

ADC performance accounts for most of the overall performance of the IoT system. Although there are various types of ADCs, a single slope ADC, which is most commonly used in many systems, is mainly used.

The single slope ADC can convert an analog voltage into a digital signal through a process of comparing a ramp signal with an input signal having a constant level.

Generally, the single slope ADC can convert an analog voltage value into a more accurate digital value by reducing a ramp signal with a constant slope over time to compare the ramp signal with an input signal.

The single slope ADC includes a comparator for comparing an input signal with a ramp signal, a ramp generator for generating a ramp signal, and a counter for converting the input signal into a digital code using a flag signal of the comparator.

However, in the case of a single slope ADC, an operating range of an input signal is limited according to a predetermined input range of the comparator.

SUMMARY OF THE INVENTION

The present disclosure is directed to providing a single slope analog-to-digital converter (ADC) capable of accepting an input signal range twice as large as that of the related art and being applied to actual products with simplified logic, and an operating method thereof.

In addition, the present disclosure is directed to providing a single slope ADC capable of being easily applied to a structure used in a commercial product without any significant changes and being used as a basic operation type structure used in the existing commercial product, as necessary, and an operating method thereof.

Objectives of the present disclosure are not limited to the above-described objectives, and other objectives and advantages of the present disclosure, which are not described, can be understood by the following description and also will be more clearly understood through exemplary embodiments of the present disclosure. It will also be readily apparent that the objectives and advantages of the present disclosure may be realized and attained by the means and combinations thereof described in the appended claims.

According to an aspect of the present disclosure, there is provided a method of operating a single slope ADC, which includes receiving an input signal from a sensor or a ramp signal from a ramp generator according to a state of a switch and sampling the received input or ramp signal; comparing, by a comparator, whether the sampled ramp signal is present in a predetermined input range in a state in which the ramp generator maintains an off state and outputting a comparison result; generating, by a logic part, a flag signal indicating a high or low according to the comparison result by the comparator and providing the flag signal to the ramp generator; and sampling, by the ramp generator, a reference voltage of the comparator according to the flag signal based on an off or on state.

The generating of, by the logic part, the flag signal indicating the high or low according to the comparison result by the comparator and the providing of the flag signal to the ramp generator may include generating a flag signal indicating a high and providing the flag signal to the ramp generator when the sampled ramp signal is present in the predetermined input range on the basis of the comparison result by the comparator.

Maintaining the ramp generator in the off or on state according to the flag signal may include maintaining the ramp generator in the on state when the flag signal indicates the high.

The generating of, by the logic part, the flag signal indicating the high or low according to the comparison result by the comparator and the providing of the flag signal to the ramp generator may include generating a flag signal indicating a low and providing the flag signal to the ramp generator when the sampled ramp signal is present outside the predetermined input range on the basis of the comparison result by the comparator.

The maintaining of the ramp generator in the off or on state according to the flag signal may include maintaining the ramp generator in the off state when the flag signal indicates the low.

According to another aspect of the present disclosure, there is provided a single slope ADC including a switch configured to provide a path for receiving an input signal from a sensor and a path for receiving a ramp signal from a ramp generator, a comparator configured to receive a sampled input signal or a sampled ramp signal according to a state of the switch, compare whether the sampled ramp signal is present in a predetermined input range in a state in which the ramp generator maintains an off state, and output the comparison result, a logic part configured to generate a flag signal indicating a high or low according to the comparison result by the comparator, and a ramp generator which maintains an off or on state according to the flag signal received from the logic part.

The logic part may generate the flag signal indicating the high and provide the flag signal to the ramp generator when the sampled ramp signal is present in the predetermined input range on the basis of the comparison result by the comparator.

The ramp generator may maintain the on state when the flag signal indicates the high.

The logic part may generate a flag signal indicating a low and provide the flag signal to the ramp generator when the sampled ramp signal is present outside the predetermined input range on the basis of the comparison result by the comparator.

The ramp generator may maintain the off state when the flag signal indicates the low.

BRIEF DESCRIPTION OF THE DRAWINGS

The above and other objects, features and advantages of the present disclosure will become more apparent to those skilled in the art by describing exemplary embodiments thereof in detail with reference to the accompanying drawings, in which.

DETAILED DESCRIPTION OF EXEMPLARY EMBODIMENTS

Figure 1:
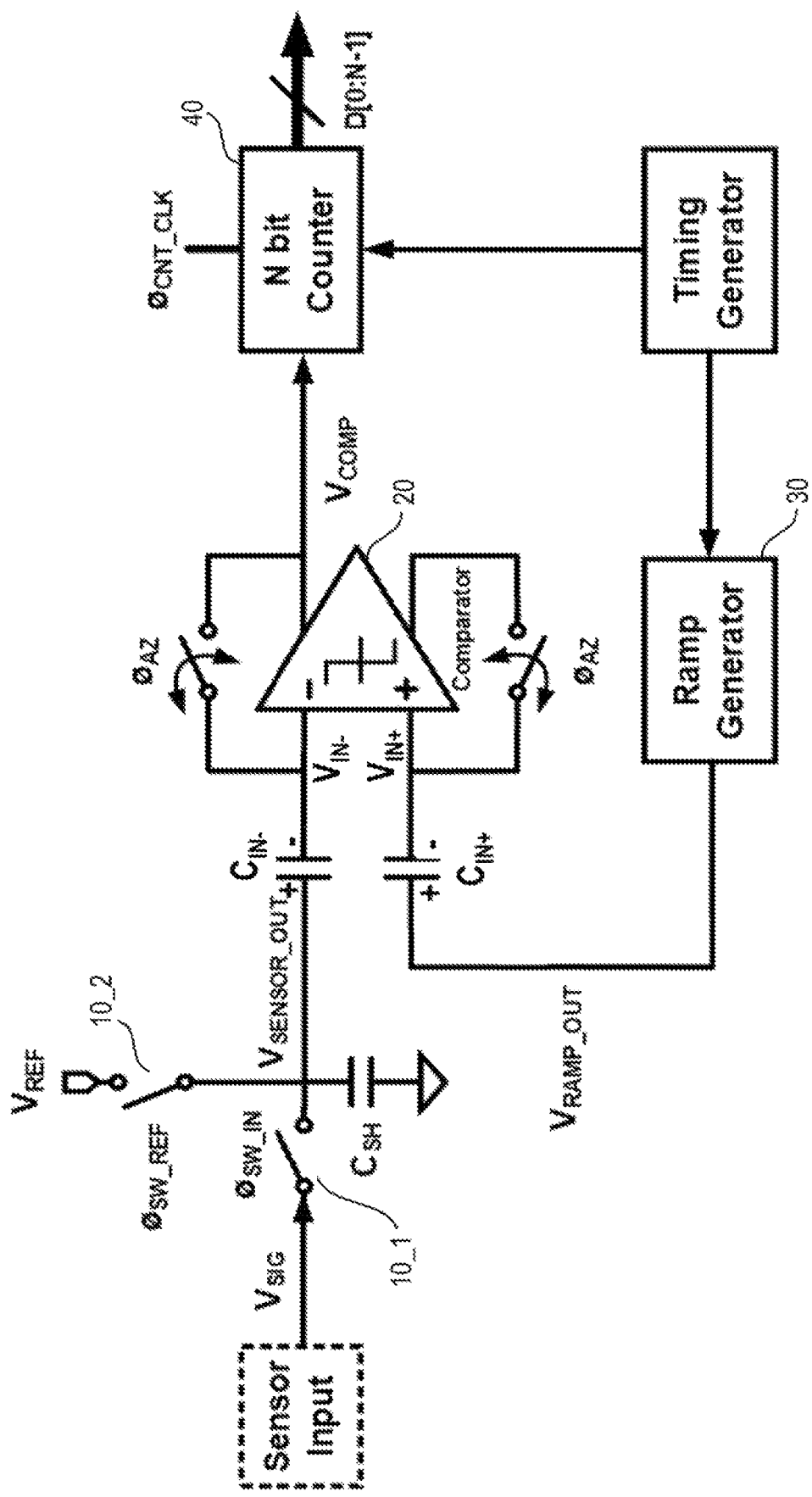
FIG. 1 is a diagram for describing a conventional single slope analog-to-digital converter (ADC)

The above and other objectives, features, and advantages of the present disclosure will be described in detail with reference to the accompanying drawings, and accordingly, the technical spirit of the present disclosure can be easily implemented by those skilled in the art to which the present disclosure pertains. Also, in the following description of the present disclosure, when a detailed description of the known related art is determined to obscure the gist of the present disclosure, the detailed description thereof will be omitted. Hereinafter, exemplary embodiments of the present disclosure will be described in detail with reference to the accompanying drawings. In the drawing, the same reference numeral refers to the same or similar component.

The present disclosure was supported by "Regional Innovation Strategy (RIS)" National Research Foundation of Korea (NRF) funded by the Ministry of Education (MOE) (2022RIS-005).

FIG. 1 is a diagram for describing a conventional single slope analog-to-digital converter (ADC).

Referring to FIG. 1, the single slope ADC includes a sensor input switch 10_1, a reference voltage input switch 10_2, a comparator 20, a ramp generator 30, and a counter 40.

By switching to an on or off state of the sensor input switch 10_1, an input signal $V_{SIG}$ is received.

By switching to an on or off state of the reference voltage input switch 10_2 ($\emptyset_{SW\_REF}$), a reference voltage signal $V_{REF}$ is received.

At a positive (+) input terminal of the comparator 20, when the reference voltage input switch is switched to an on state to receive the reference voltage, the reference voltage signal is sampled at a positive (+) polarity of an AC coupling capacitor.

In this case, an auto zero switch $\emptyset_{AZ}$ of the comparator 20 is maintained in an on state, and finally, the reference voltage $V_{REF}$ of the signal is sampled at the positive (+) polarity of the AC coupling capacitor, and a reference voltage $V_{CM}$ of the comparator is sampled at a negative (−) polarity of the AC coupling capacitor.

Then, when the auto zero switch $\emptyset_{AZ}$ of the comparator 20 is turned off and a state of the sensor input switch 10_1 is switched to the on state to receive the input signal $V_{SIG}$, the input signal $V_{SIG}$ is sampled at the positive (+) polarity of the AC coupling capacitor, and a voltage at the negative (−) polarity of the AC coupling capacitor becomes a floating state, and thus a voltage VIN+ drops as much as the amount of change in the input signal. That is, the voltage at the negative (−) polarity of the AC coupling capacitor drops as much as the amount of change in the input signal ($V_{REF}$-$V_{SIG}$) from the reference voltage $V_{CM}$ of the comparator.

In addition, in the case of the positive input terminal of the comparator 20, a ramp generator initial voltage $V_{RAMP\_CM}$ is sampled at a positive (+) terminal of the AC coupling capacitor, the reference voltage $V_{CM}$ of the comparator is sampled at a negative (−) terminal of the AC coupling capacitor, and the counter 40 operates until the comparator 20 simultaneously operates with the ramp generator 30.

The ramp generator 30 may provide a ramp signal $V_{RAMP\_OUT}$ that varies according to time during a specific time period. Here, the ramp signal $V_{RAMP\_OUT}$ corresponds to a reference voltage for comparison with the input signal $V_{SIG}$ during an analog-to-digital conversion process.

The counter 40 operates until the comparator 20 simultaneously operates with the ramp generator 30, and when operation of the comparator 20 proceeds, the comparator 20 compares the sampled input signal and the ramp signal $V_{RAMP\_OUT}$ generated by the ramp generator 30 to generate a flag signal indicating a low or high according to a comparison result.

As described above, in this case, when the sampled input signal is present in an input range of the comparator 20, the counter 40 operates to output a digital code until the comparator 20 latches.

For example, assuming 10-bit code conversion, when the sampled input signal is present in the input range of comparator 20, the counter 40 may operate to output $2^{10}$ digital codes at most until the comparator 20 latches. In this case, the input range of comparator 20 means a biased input range allowing all transistors in the comparator 20 to operate normally.

As described above, in the case of the conventional single slope ADC, a dynamic range of the input signal is limited according to the input range of the comparator 20.

Then, when the auto zero switch $\emptyset_{AZ}$ of the comparator 20 is turned off and a state of the sensor input switch 10_1 is switched to the on-state to receive the input signal $V_{SIG}$, the input signal $V_{SIG}$ is sampled at the positive (+) polarity of the AC coupling capacitor, and a voltage at the negative (−) polarity of the AC coupling capacitor becomes a floating state, and thus a voltage drops as much as the amount of change in the input signal. That is, the voltage at the negative (−) polarity of the AC coupling capacitor drops as much as the amount of change in the input signal ($V_{REF}$-$V_{SIG}$) from the reference voltage $V_{CM}$ of the comparator.

In addition, in the case of the positive input terminal of the comparator 20, a ramp generator initial voltage $V_{RAMP\_CM}$ is sampled at a positive (+) terminal of the AC coupling capacitor, the reference voltage $V_{CM}$ of the comparator is sampled at a negative (−) terminal of the AC coupling capacitor, and the counter 40 operates until the comparator 20 simultaneously operates with the ramp generator 30.

Figure 2:
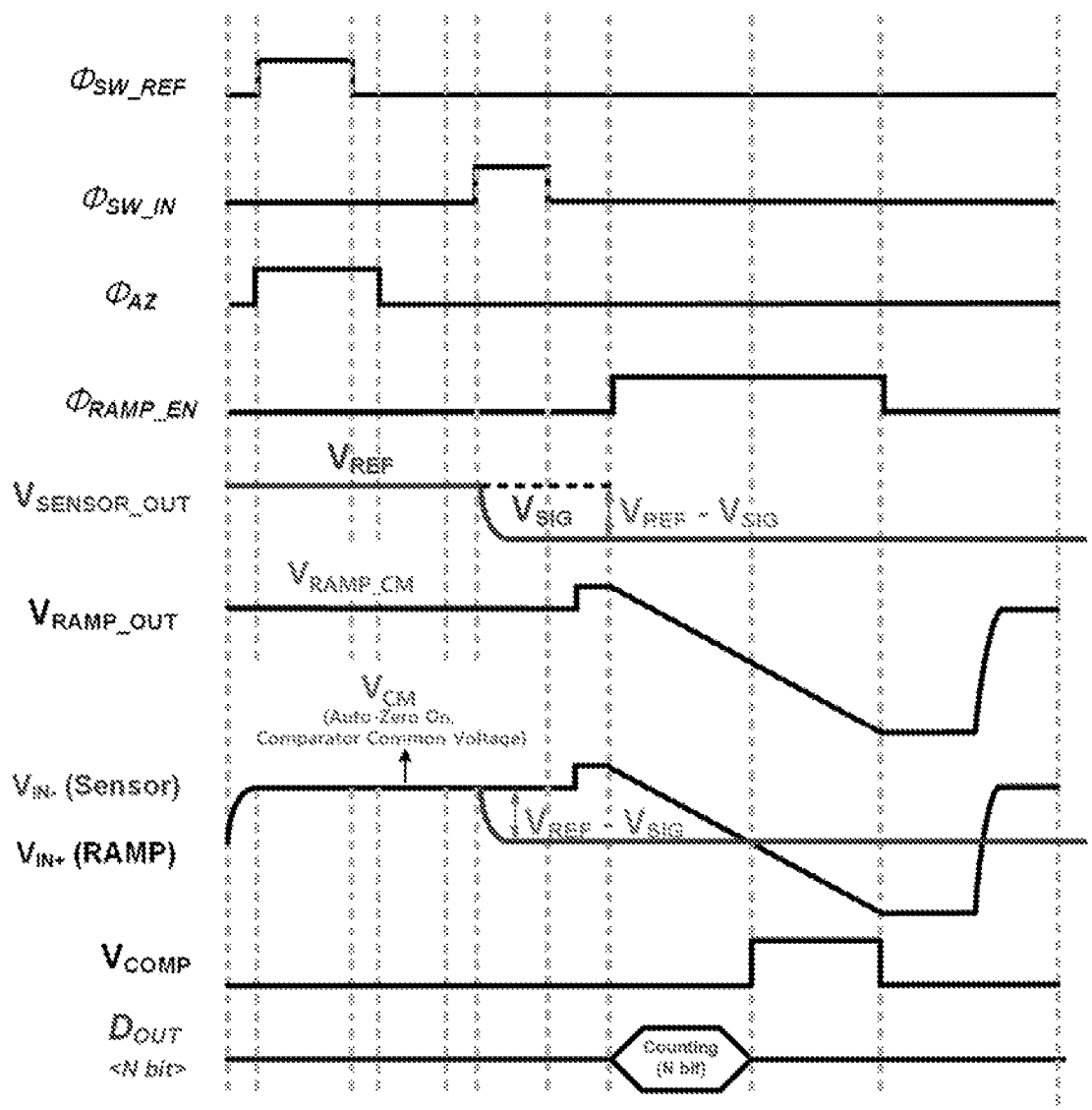
FIG. 2 is an operation timing diagram illustrating a case in which an input signal is present in a predetermined input range in the conventional single slope ADC.
Figure 3:
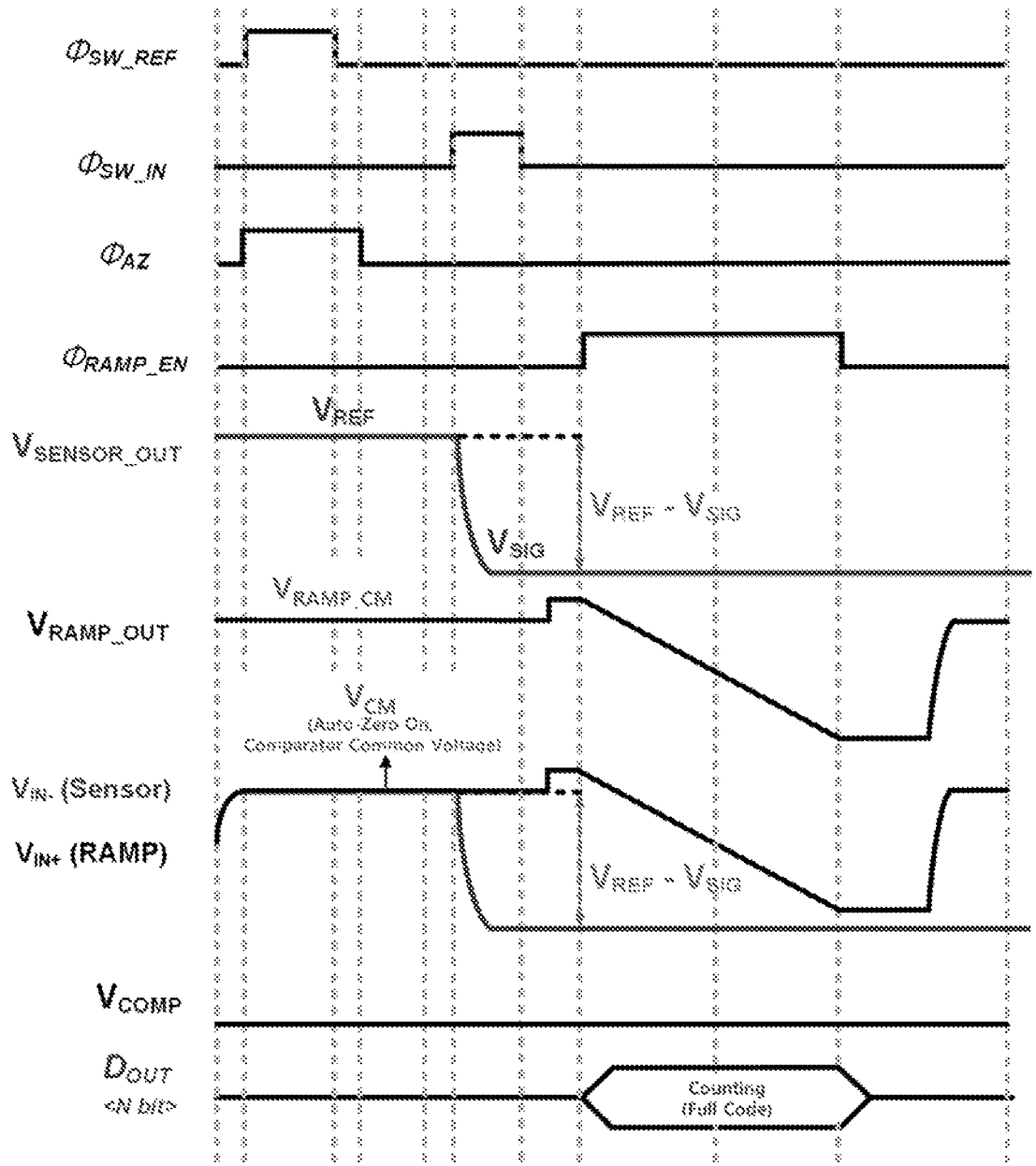
FIG. 3 is an operation timing diagram illustrating a case in which an input signal is present outside a predetermined input range in the conventional single slope ADC.

FIG. 2 is an operation timing diagram illustrating a case in which an input signal is present within a predetermined input range in the conventional single slope ADC. FIG. 3 is an operation timing diagram illustrating a case in which an input signal is present outside a predetermined input range in the conventional single slope ADC.

Referring to FIGS. 2 and 3, by switching to an on or off state of the sensor input switch 10_1, the input signal $V_{SIG}$ is received. By switching to an on or off state of the reference voltage input switch 10_2 ($\emptyset_{sw\_REF}$), the reference voltage signal $V_{REF}$ is received.

When the reference voltage input switch 10_2 (ØSW_REF) switches to an on state to receive the reference voltage, the reference voltage signal is sampled at a positive (+) polarity of an AC coupling capacitor.

In this case, an auto zero switch $\emptyset_{AZ}$ of the comparator 20 is maintained in an on state, and finally, the reference voltage $V_{REF}$ of the signal is sampled at the positive (+) polarity of the AC coupling capacitor, and a reference voltage $V_{CM}$ of the comparator is sampled at a negative (−) polarity of the AC coupling capacitor.

In the case of conventional single slope analog-to-digital conversion, when the sampled input signal $V_{SIG}$ is present in the input range of the comparator 20, the counter 40 operates to output digital codes until the comparator 20 latches as shown in FIG. 2.

v On the other hand, in the case of conventional single slope analog-to-digital conversion, when the sampled input signal $V_{SIG}$ is present outside the input range of the comparator 20, the counter 40 operates to output $2^{10}$ digital codes at most as shown in FIG. 3.

For example, assuming 10-bit code conversion, when the sampled input signal is present in the input range of comparator 20, the counter 40 may operate to output $2^{10}$ digital codes at most until the comparator 20 latches. In this case, the input range of comparator 20 is an input range allowing all the transistors in the comparator to operate.

As another example, assuming 10-bit code conversion, when the sampled input signal is present outside the input range of comparator 20, $2^{10}$ digital codes at most are output.

That is, in the case of conventional single slope analog-to-digital conversion, when the sampled input signal is present in the input range of comparator 20, an analog code may be converted into a digital code as shown in the reference number 220 of FIG. 2, and when the sampled input signal is present outside the input range of the comparator 20, $2^{10}$ digital codes are output as shown in reference number 320 of FIG. 3.

Figure 4:
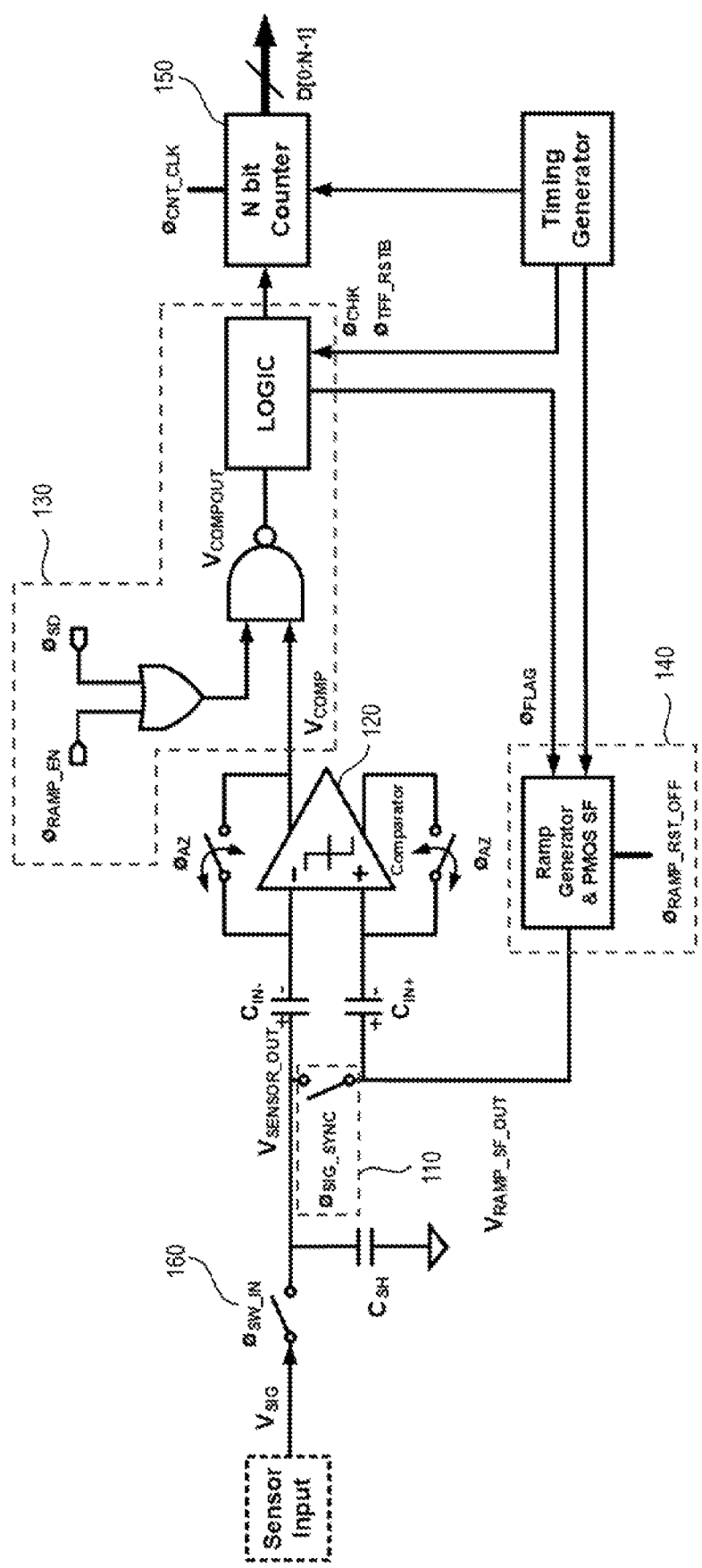
FIG. 4 is a diagram for describing a single slope ADC according to one embodiment of the present disclosure.

FIG. 4 is a diagram for describing a single slope ADC according to one embodiment of the present disclosure.

Referring to FIG. 4, a single slope ADC 100 includes a switch 110, a comparator 120, a logic part 130, a ramp generator 140, and a counter 150.

The switch 110 provides a path for receiving an input signal $V_{SIG}$ from a sensor and a path for receiving a ramp signal $V_{RAMP\_SF\_OUT}$ from the ramp generator 140. The ramp generator 140 includes a P-type metal oxide semiconductor field effect transistor (MOSFET) source follower capable of adjusting a DC voltage range of a signal.

When the switch 110 maintains an off state, the switch 110 provides a path for receiving the input signal $V_{SIG}$ from the sensor, and when the switch 110 maintains an on state, the switch 110 provides a path for receiving the ramp signal $V_{RAMP\_SF\_OUT}$ from the ramp generator 140.

In one example, when a state of the switch 110 maintains an off state and the switch 110 provides a path for receiving the input signal $V_{SIG}$ from the sensor, a state of a sensor input switch 160 ($\emptyset_{SW\_IN}$) is switched to an on state and thus the input signal $V_{SIG}$ is received from the sensor, and the received input signal $V_{SIG}$ is sampled and provided to the comparator 120.

In another example, when a state of the switch 110 maintains an on state and the switch 110 provides a path for receiving the ramp signal $V_{RAMP\_SF\_OUT}$ from the ramp generator 140, the ramp signal $V_{RAMP\_SF\_OUT}$ received from the ramp generator 140 is provided to the comparator 120.

The comparator 120 receives the sampled input signal $V_{SIG}$ or the ramp signal $V_{RAMP\_SF\_OUT}$ according to the state of the switch 110 and compares whether the sampled input signal is present in a predetermined input range in a state in which the ramp generator 140 maintains the off state to output the comparison result.

Then, the comparator 120 compares whether the sampled input signal is present in the predetermined input range in the state in which the ramp generator 140 maintains the off state and provides the comparison result to the logic part 130. Accordingly, the logic part 130 may generate a flag signal indicating a high or low according to a comparison result by the comparator 120.

The logic part 130 may generate the flag signal indicating a high or low according to the comparison result by the comparator 120.

More specifically, the logic part 130 may generate the flag signal indicating a high or low according to an output voltage $V_{COMP}$ of the comparator 120.

In one example, the logic part 130 may generate a flag signal indicating a high based on the output voltage $V_{COMP}$ of the comparator 120 when the sampled input signal $V_{SIG}$ is present in a predetermined input range.

As in the above example, when the flag signal indicating the high is generated by the logic part 130, the ramp generator 140 may maintain an on state to generate a ramp signal $V_{RAMPON}$ indicating an on state.

As described above, when the ramp generator 140 generates the ramp signal $V_{RAMPON}$ indicating the on state, the input signal $V_{SIG}$ is received from the sensor and is AC-coupled based on the ramp signal $V_{RAMPON}$.

Accordingly, an output voltage $V_{SENSOR\_OUT}$ of the sensor becomes the ramp signal $V_{RAMPON}$, and a ramp signal of the ramp generator 140 becomes the ramp signal $V_{RAMPON}$ indicating the on state.

In another example, the logic part 130 may generate a flag signal indicating a low based on the output voltage $V_{COMP}$ of the comparator 120 when the sampled input signal $V_{SIG}$ is present outside the predetermined input range.

As in the above example, when the flag signal indicating the low is generated by the logic part 130, the ramp generator 140 may maintain an off state to generate a ramp signal $V_{RAMPOFF}$ indicating an off state.

As described above, when the ramp generator 140 generates the ramp signal $V_{RAMPOFF}$ indicating the off state, the input signal $V_{SIG}$ is received from the sensor and is AC-coupled based on the ramp signal $V_{RAMPOFF}$.

Accordingly, the output voltage $V_{SENSOR\_OUT}$ of the sensor becomes the ramp signal $V_{RAMPOFF}$, and a ramp signal of the ramp generator 140 becomes the ramp signal $V_{RAMPOFF}$ indicating the off state.

The ramp generator 140 may provide a ramp signal $V_{RAMP\_SF\_OUT}$. More specifically, the ramp generator 140 may provide the ramp signal $V_{RAMP\_SF\_OUT}$ that varies according to time during a specific time period. Here, the ramp signal $V_{RAMP\_SF\_OUT}$ corresponds to a reference voltage for comparison with the input signal $V_{SIG}$ during an analog-to-digital conversion process.

For example, the ramp generator 140 may generate a ramp signal $V_{RAMP\_SF\_OUT}$ that decreases as much as a specific voltage interval (e.g., an interval of one mV) every specific period (e.g., a clock unit) based on a specific voltage (e.g., 2.2 V) during a predetermined specific time period and may provide the ramp signal $V_{RAMP\_SF\_OUT}$ forming a ramp over time.

When the sampled input signal $V_{SIG}$ is present in the predetermined input range and the sensor input switch 160 ($Ø_{SW\_IN}$) is switched to an on state, the input signal $V_{SIG}$ drops according to the ramp signal $V_{RAMPON}$ at a switch $Ø_{RAMP\_RST\_OFF}$ which switches the output voltage of the ramp generator 140 to an off state. That is, when the sensor input switch 160 ($Ø_{SW\_IN}$) is switched to the on state, the input signal $V_{SIG}$ drops as much as the ramp signal $V_{RAMPON}$–the input signal $V_{SIG}$ When the sampled input signal $V_{SIGt}$ is present outside the predetermined input range and the sensor input switch 160 ($Ø_{SW\_IN}$) is switched to the on state, the input signal $V_{SIG}$ drops according to the ramp signal $V_{RAMPOFF}$ at the switch $Ø_{RAMP\_RST\_OFF}$ which switches the output voltage of the ramp generator 140 to an off state. That is, when the sensor input switch 160 ($Ø_{SW\_IN}$) is switched to the on state, the input signal $V_{SIG}$ drops as much as the ramp signal $V_{RAMPOFF}$–the input signal $V_{SIG}$.

The counter 150 counts signals of different magnitudes according to whether the sampled input signal $V_{SIG}$ is present in the predetermined input range.

In one example, when the sampled input signal $V_{SIG}$ is present in the predetermined input range, the counter 150 counts as many signals as the difference between the ramp signal $V_{RAMPON}$ with all current cells of the ramp generator 140 turned on and the input signal $V_{SIG}$ received from the sensor.

The reason for this is that, when the sampled input signal $V_{SIG}$ is present in the predetermined input range, the state of the ramp generator 140 maintains the on state and the ramp signal $V_{RAMPON}$ indicating the on state is output, and the auto zero switch $Ø_{AZ}$ is turned on at the corresponding point of time. Therefore, an input at the negative (−) terminal of the comparator 120 varies as much as the difference between the ramp signal $V_{RAMPON}$ and the input signal $V_{SIG}$.

In another example, when the sampled input signal $V_{SIG}$ is present outside the predetermined input range, the counter 150 counts as many signals as a difference between the ramp signal $V_{RAMPOFF}$ with the lowest voltage generated by the ramp generator 140 and the input signal $V_{SIG}$ received from the sensor.

The reason for this is that, when the sampled input signal $V_{SIG}$ is present outside the predetermined input range, the state of the ramp generator 140 maintains the off state and the ramp signal $V_{RAMPOFF}$ indicating the off state is output, and the auto zero switch $Ø_{AZ}$ is turned on at the corresponding point of time. Therefore, an input at the negative (−) terminal of the comparator 120 varies as much as the difference between the ramp signal $V_{RAMPOFF}$ and the input signal $V_{SIG}$.

FIGS. 5 to 15 are timing diagrams for describing an operation process of the single slope ADC according to one embodiment of the present disclosure.

Figure 5:
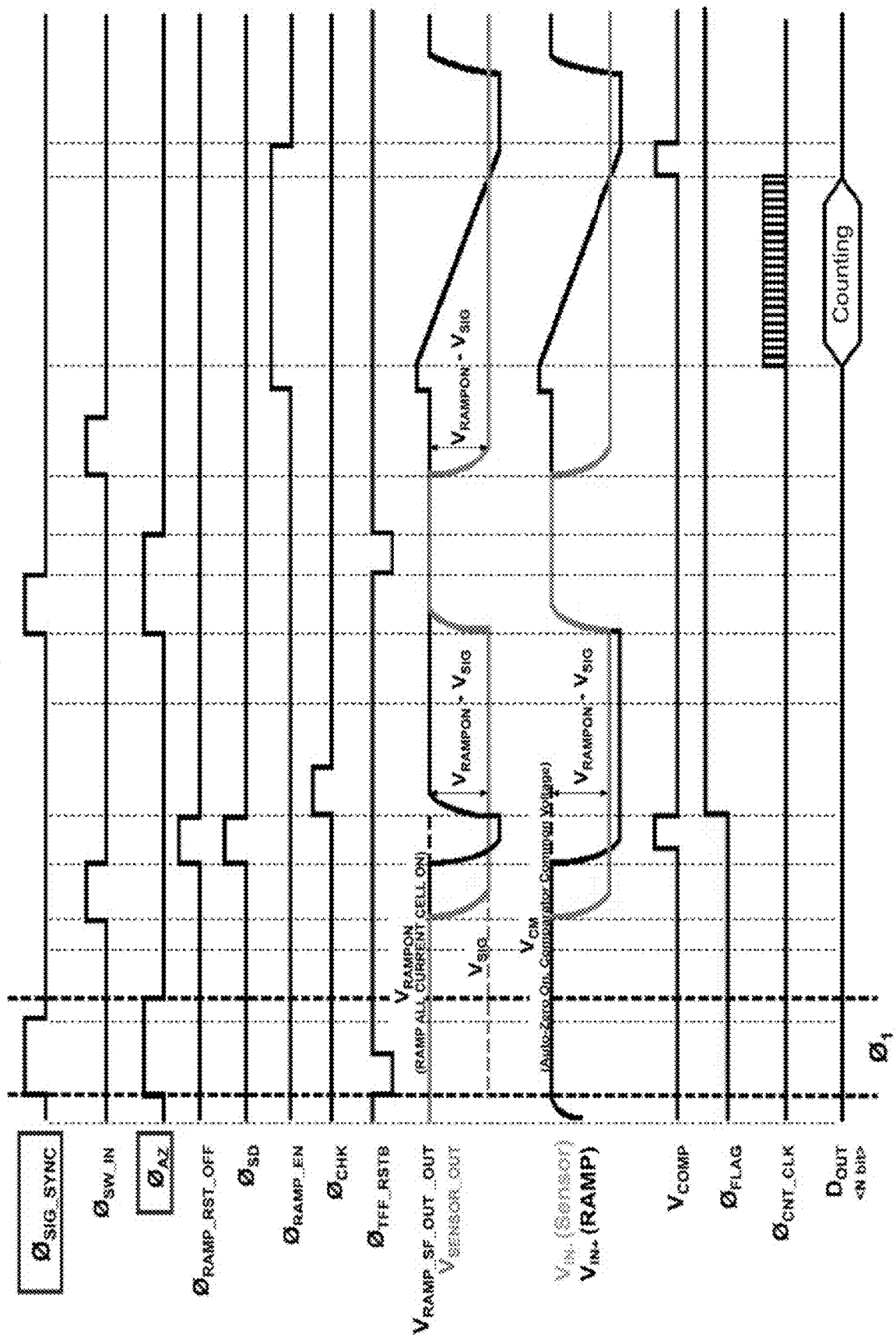
FIGS. 5 to 15 are timing diagrams for describing an operation process of the single slope ADC according to one embodiment of the present disclosure.

As shown in FIG. 5 of FIGS. 5 to 15, when the switch 110 is switched to an on state, the ramp signal $V_{RAMP\_SF\_OUT}$ of the ramp generator 140 is received and sampled, and since the state of the auto zero switch ØAZ is the on state, the ramp signal $V_{RAMP\_SF\_OUT}$ and the reference voltage $V_{CM}$ of the comparator are sampled at both ends of the AC coupling capacitor.

Figure 6:
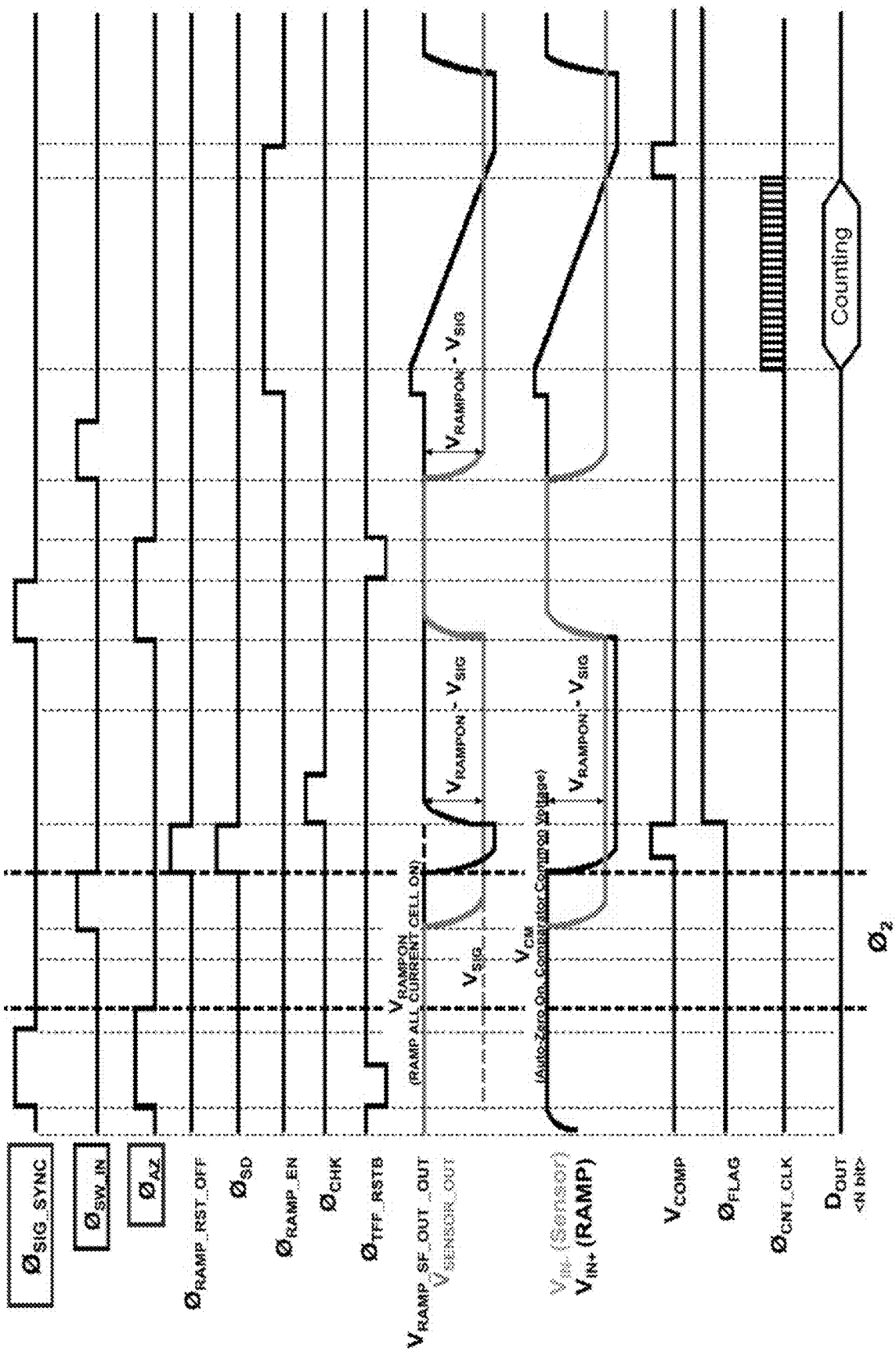

As shown in FIG. 6, when the switch 110 is switched to an off state, the state of the sensor input switch 160 ($Ø_{SW\_IN}$) is switched to an on state, and thus the input signal $V_{SIG}$ is received from the sensor and AC-coupled.

Figure 7:
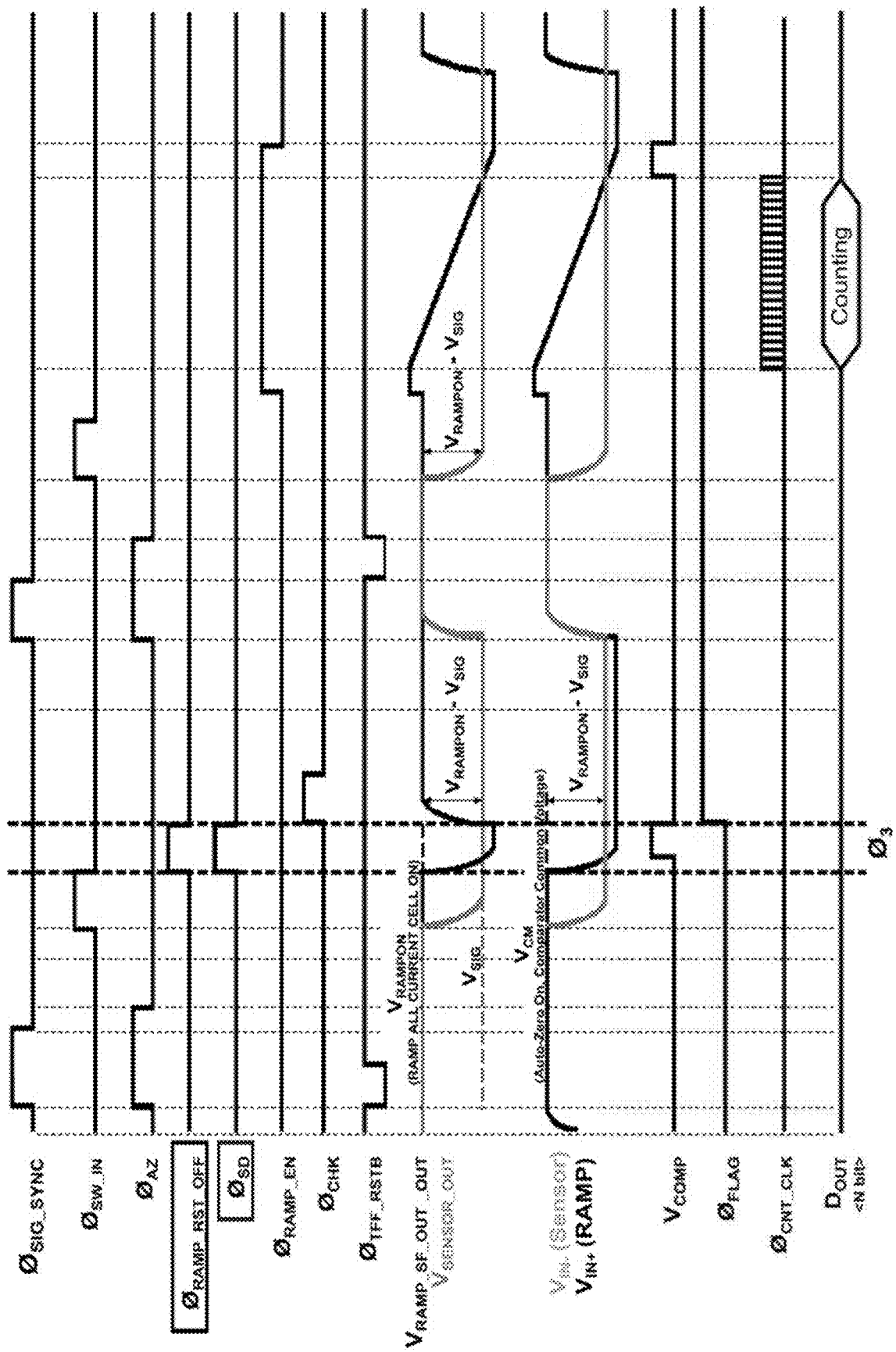

As shown in FIG. 7, the comparator 120 determines whether the sampled input signal $V_{SIG}$ is present in the predetermined input range at the switch $Ø_{RAMP\_RST\_OFF}$ which switches the output voltage of the ramp generator 140 to the off state while receiving the sampled input signal.

Figure 8:
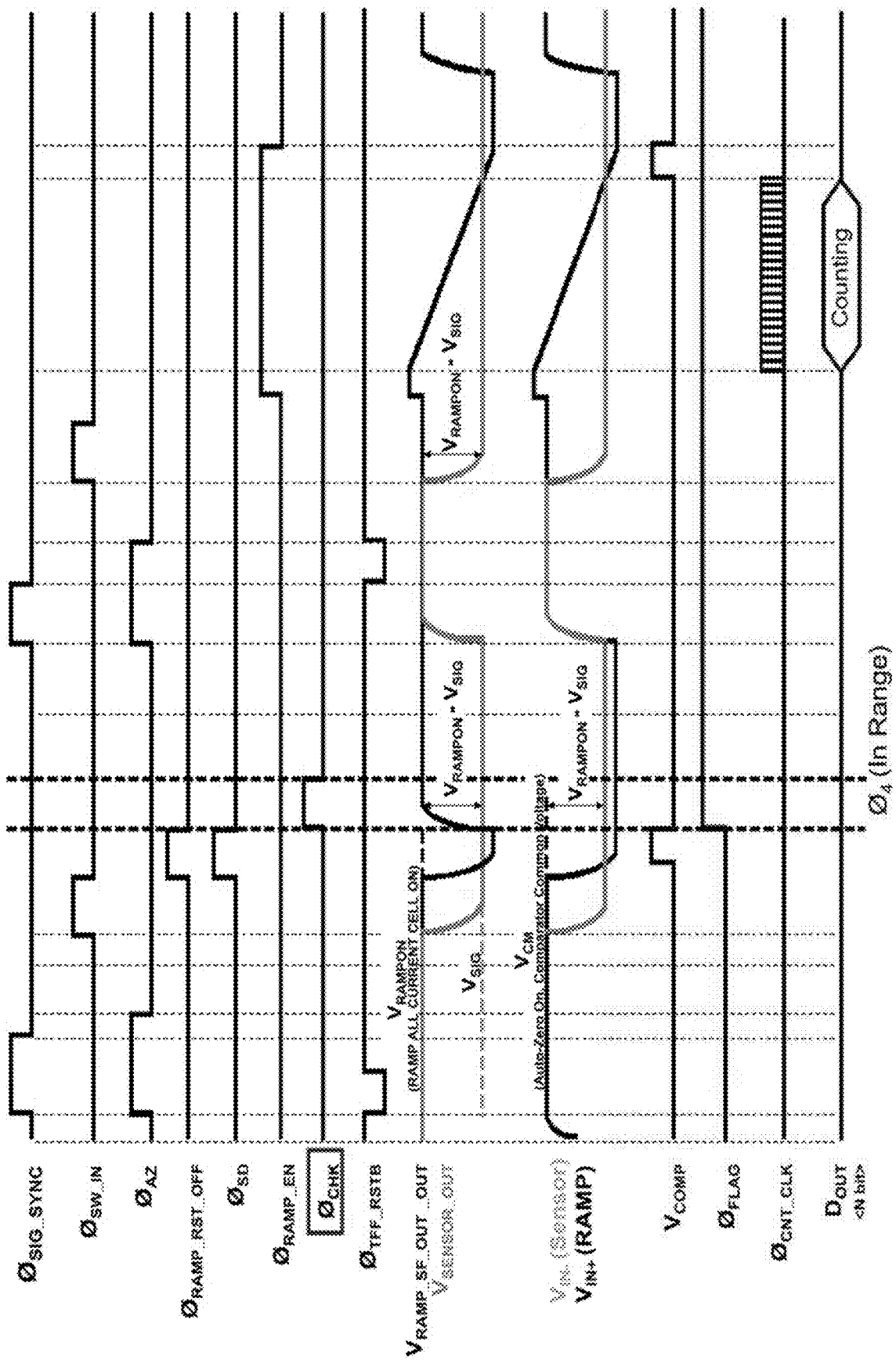

As shown in FIG. 8, at the switch $Ø_{RAMP\_RST\_OFF}$ which switches the output voltage of the ramp generator 140 to the off state while receiving the sampled input signal, when the sampled input signal $V_{SIG}$ is present in the predetermined input range, the logic part 130 may generate a flag signal indicating a high.

Figure 9:
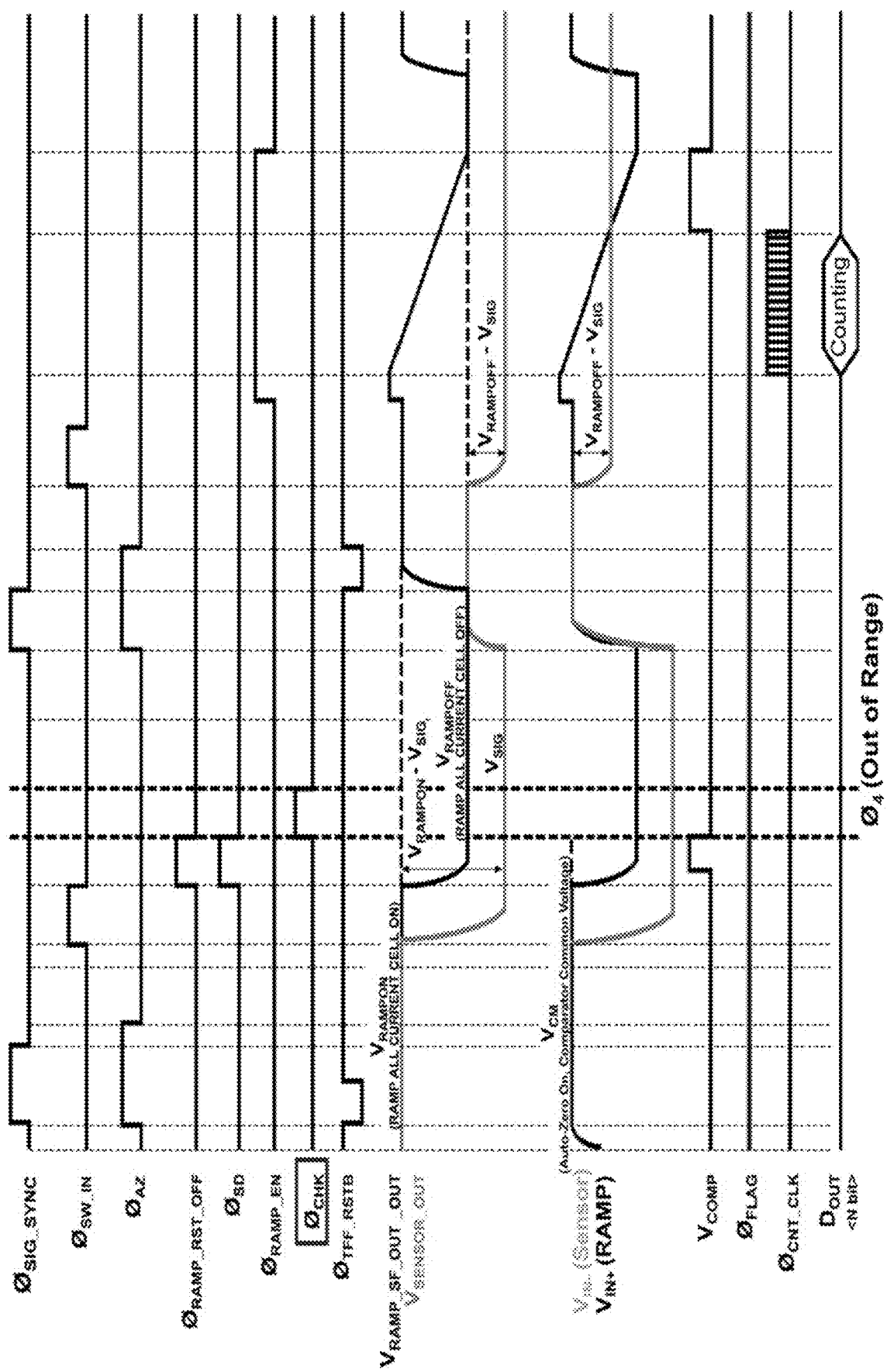

As shown in FIG. 9, at the switch $Ø_{RAMP\_RST\_OFF}$ which switches the output voltage of the ramp generator 140 to the off state while receiving the sampled input signal, when the sampled input signal $V_{SIG}$ is present outside the predetermined input range, the logic part 130 may generate a flag signal indicating a low.

The logic part 130 may generate the flag signal indicating a high or low according to the output voltage $V_{COMP}$ of the comparator 120.

Figure 10:
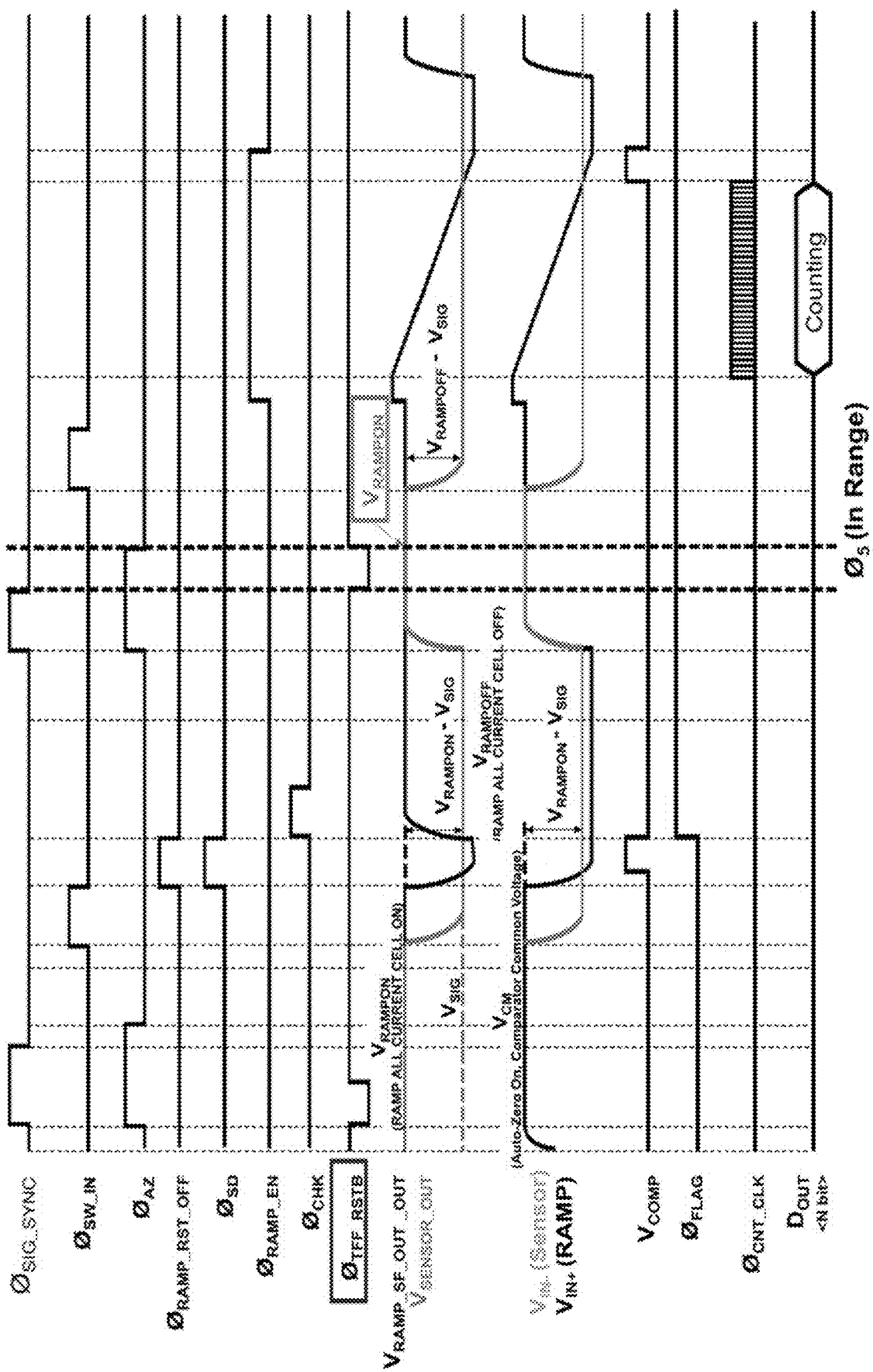

In one example, as shown in FIG. 10, based on the output voltage $V_{COMP}$ of the comparator 120, the logic part 130 may generate the flag signal indicating the high when the sampled input signal is present in the predetermined input range.

As in the above example, when the flag signal indicating the high is generated by the logic part 130, the ramp generator 140 may maintain the on state to generate the ramp signal $V_{RAMPON}$ indicating the on state.

As described above, when the ramp generator 140 generates the ramp signal $V_{RAMPON}$ indicating the on state, the input signal $V_{SIG}$ is received from the sensor and is AC-coupled based on the ramp signal $V_{RAMPON}$.

Accordingly, an output voltage $V_{SENSOR\_OUT}$ of the sensor becomes the ramp signal $V_{RAMPON}$, and a ramp signal of the ramp generator 140 becomes the ramp signal $V_{RAMPON}$ indicating the on state.

Figure 11:
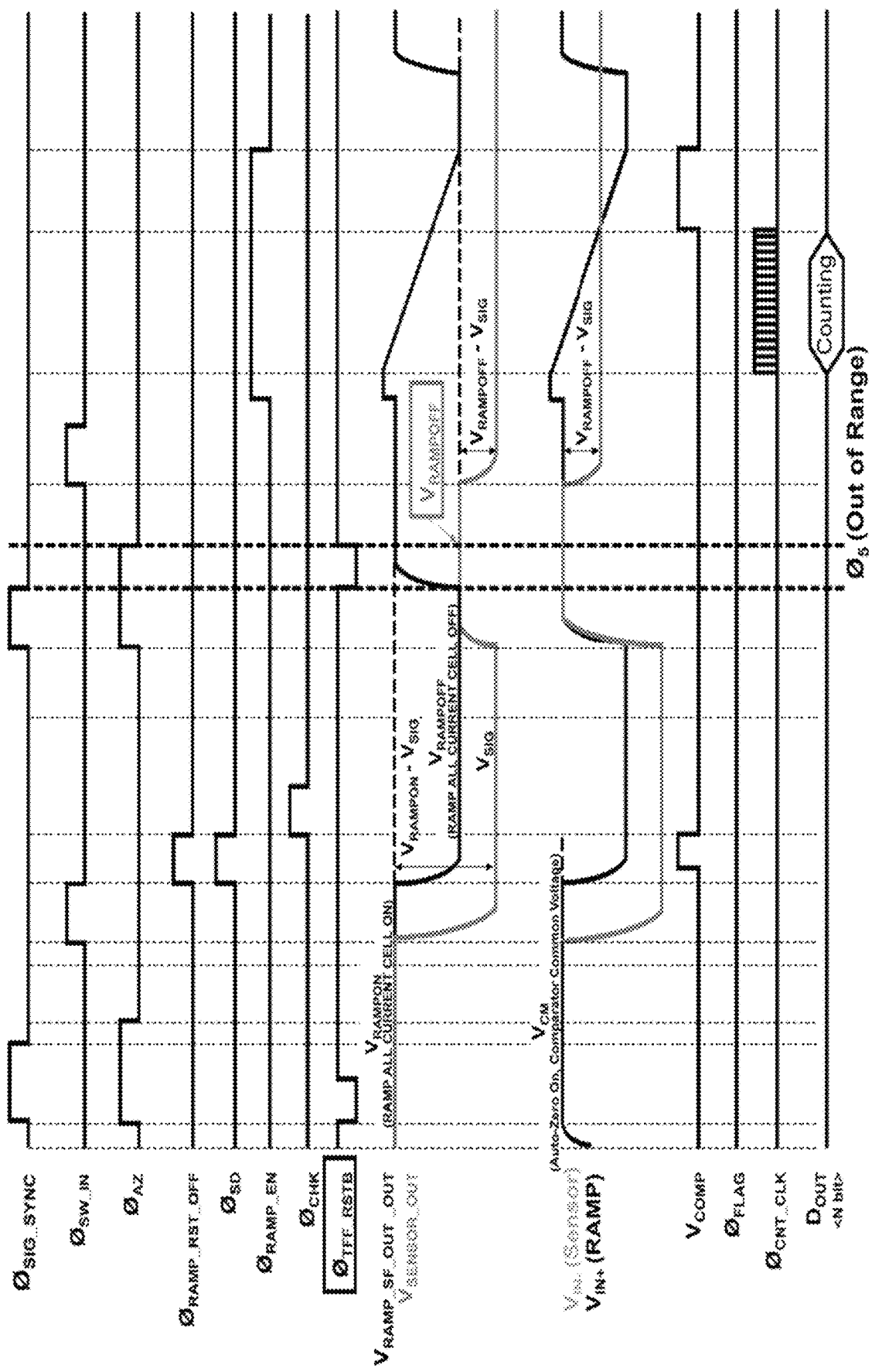

In another example, as shown in FIG. 11, based on the output voltage $V_{COMP}$ of the comparator 120, the logic part 130 may generate a flag signal indicating a low when the sampled input signal is present outside the predetermined input range.

As in the above example, when the flag signal indicating the low is generated by the logic part 130, the ramp generator 140 may maintain the off state to generate the ramp signal $V_{RAMPOFF}$ indicating the off state.

As described above, when the ramp generator 140 generates the ramp signal $V_{RAMPOFF}$ indicating the off state, the input signal $V_{SIG}$ is received from the sensor and is AC-coupled based on the ramp signal $V_{RAMPOFF}$.

Accordingly, the output voltage $V_{SENSOR\_OUT}$ of the sensor becomes the ramp signal $V_{RAMPOFF}$, and a ramp signal of the ramp generator 140 becomes the ramp signal $V_{RAMPOFF}$ indicating the off state.

Figure 12:
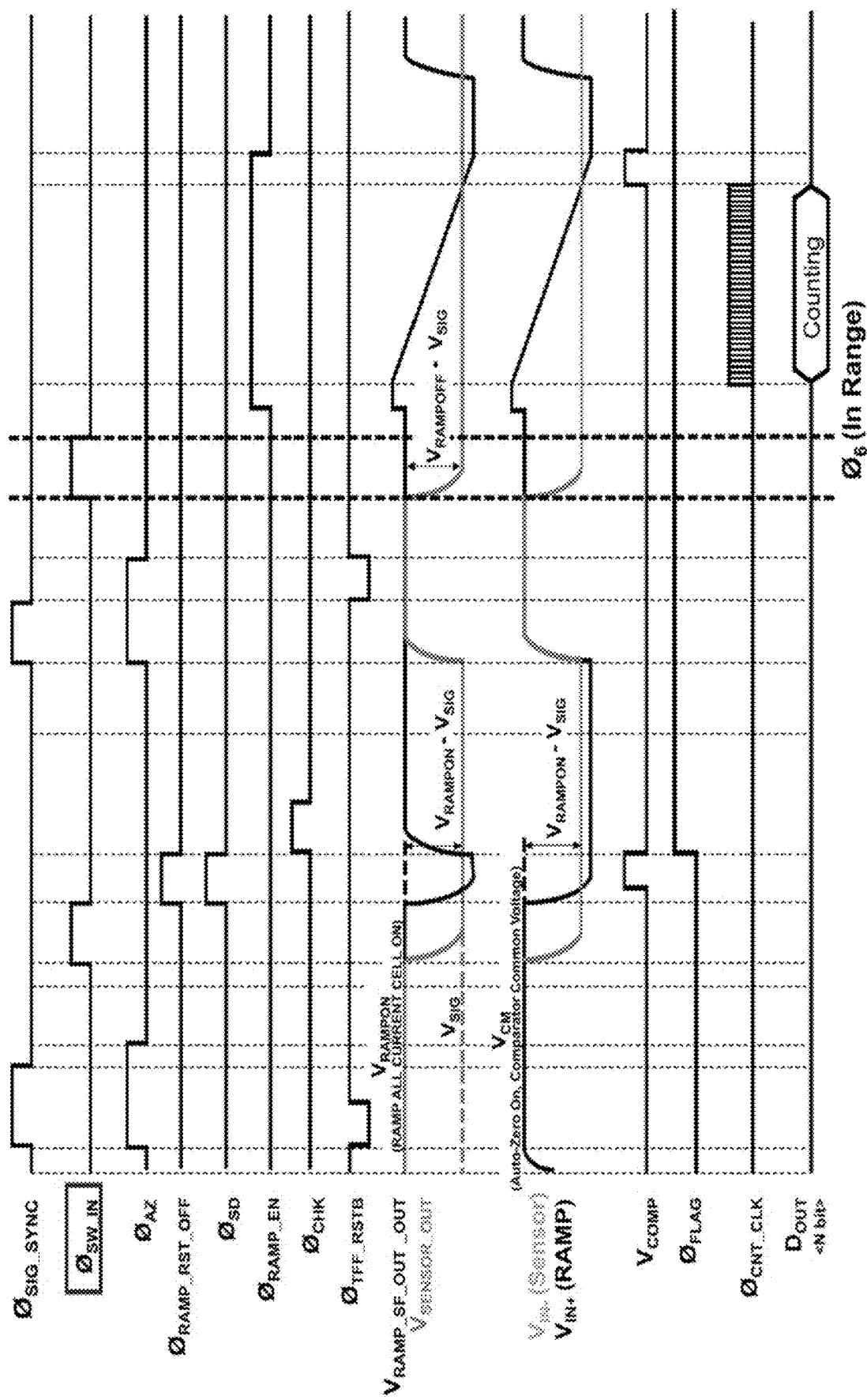

As shown in FIG. 12, when the sampled input signal $V_{SIG}$ is present in the predetermined input range at the switch $Ø_{RAMP\_RST\_OFF}$ which switches the output voltage of the ramp generator 140 to the off state and the sensor input switch 160 ($Ø_{SW\_IN}$) is switched to the on state, the input signal drops with respect to the ramp signal $V_{RAMPON}$. That is, when the sensor input switch 160 ($Ø_{SW\_IN}$) is switched to the on state, the input signal drops as much as the ramp signal $V_{RAMPON}$–the input signal $V_{SIG}$.

Figure 13:
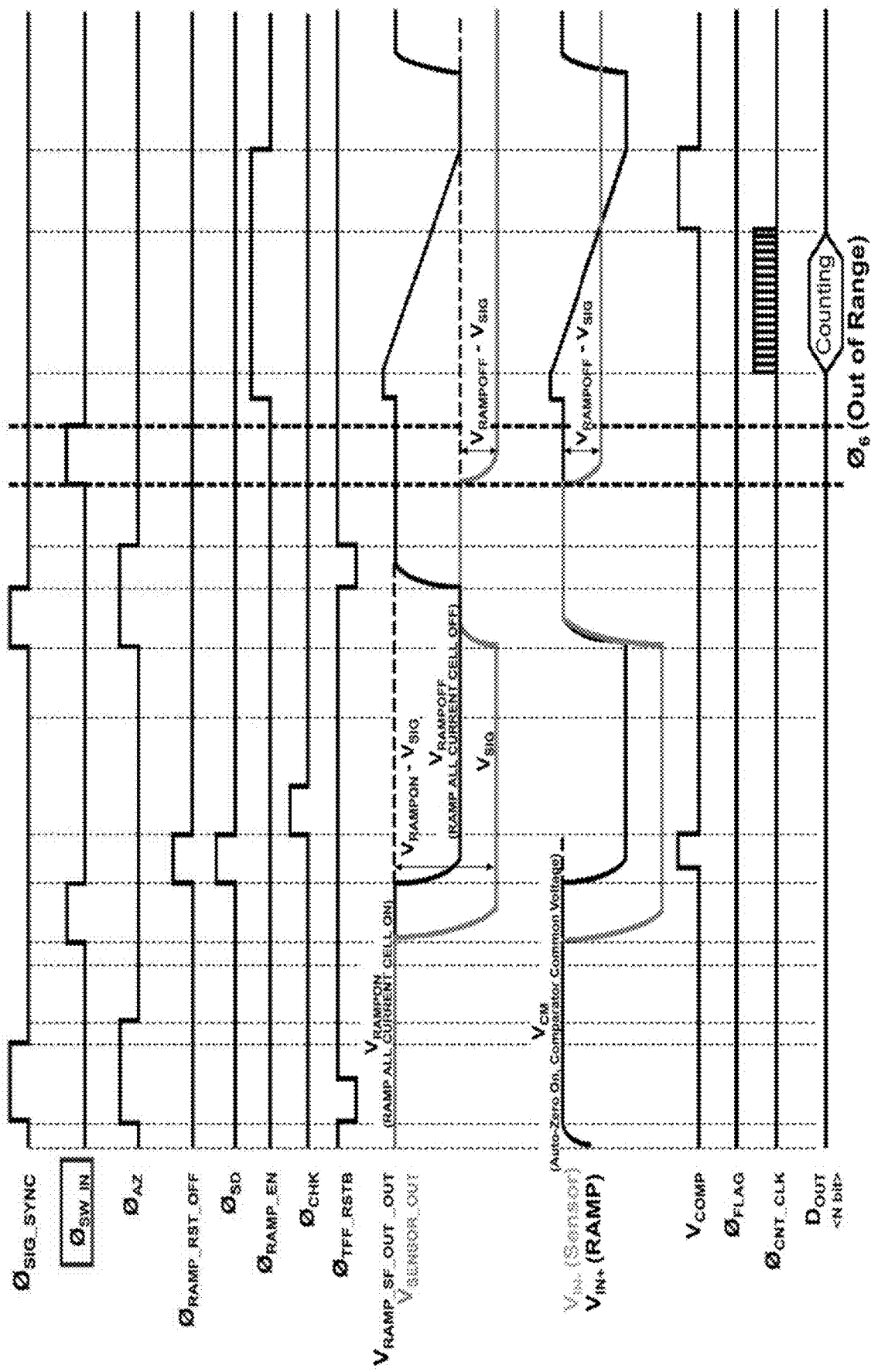

As shown in FIG. 13, when the sampled input signal $V_{SIG}$ is present outside the predetermined input range at the switch $\emptyset_{RAMP\_RST\_OFF}$ which switches the output voltage of the ramp generator 140 to the off state and the sensor input switch 160 ($\emptyset_{SW\_IN}$) is switched to the on state, the input signal drops with respect to the ramp signal $V_{RAMPOFF}$. That is, when the sensor input switch 160 ($\emptyset_{SW\_IN}$) is switched to the on state, the input signal drops as much as the ramp signal $V_{RAMPOFF}$–the input signal $V_{SIG}$.

In addition, the counter 150 counts signals of different magnitudes according to whether the sampled input signal $V_{SIG}$ is present in the predetermined input range.

Figure 14:
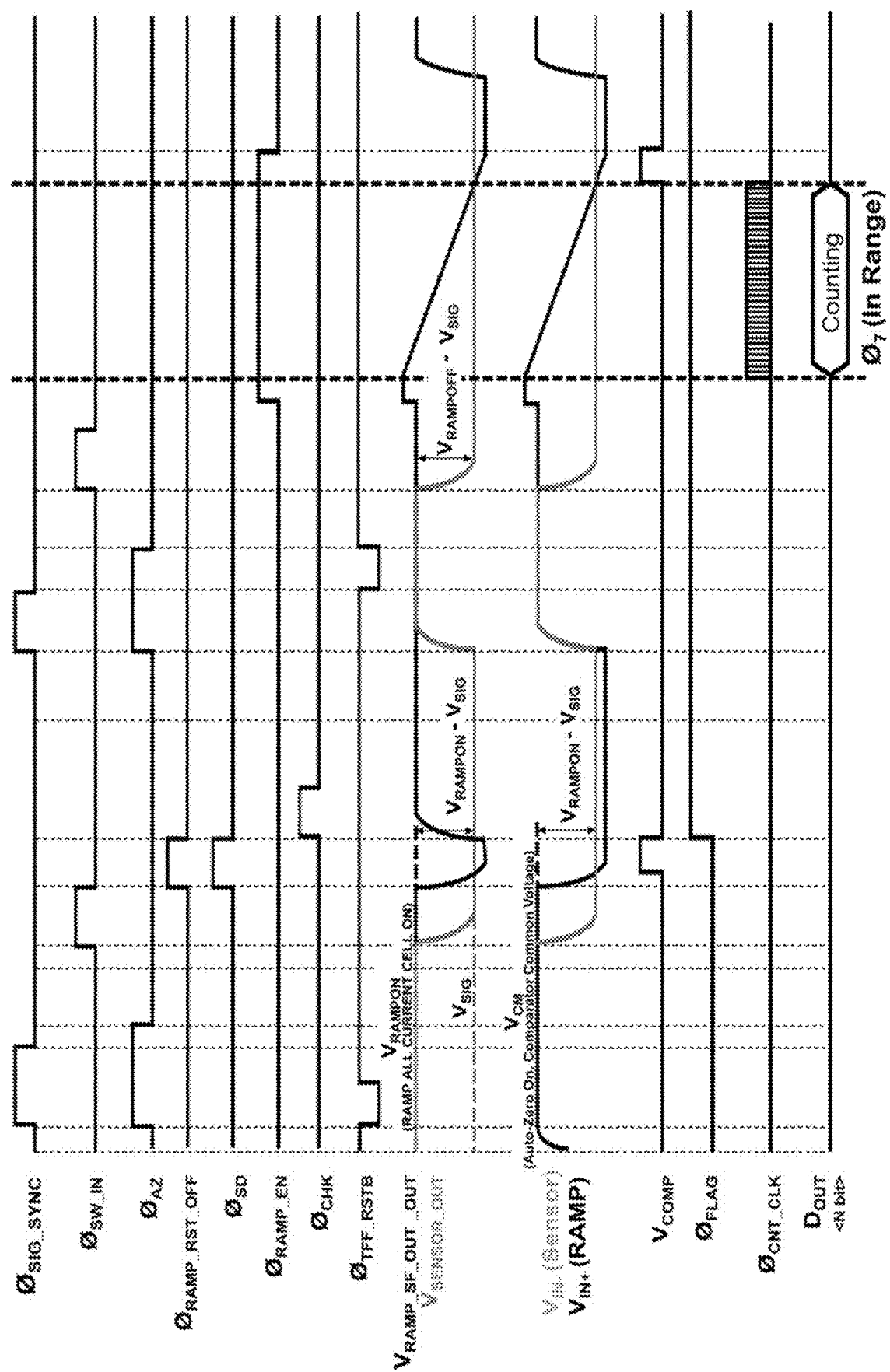

In one example, as shown in FIG. 14, when the sampled input signal $V_{SIG}$ is present in the predetermined input range, the counter 150 counts as many signals as the difference between the ramp signal $V_{RAMPON}$ with all current cells of the ramp generator 140 turned on and the input signal $V_{SIG}$ received from the sensor.

The reason for this is that, when the sampled input signal $V_{SIG}$ is present in the predetermined input range, the state of the ramp generator 140 maintains the on state and the ramp signal $V_{RAMPON}$ indicating the on state is output, and the state of the auto zero switch $\emptyset_{AZ}$ is turned on at the corresponding point of time. Therefore, an input at the negative (−) terminal of the comparator 120 varies as much as the difference between the ramp signal $V_{RAMPON}$ and the input signal $V_{SIG}$.

Figure 15:
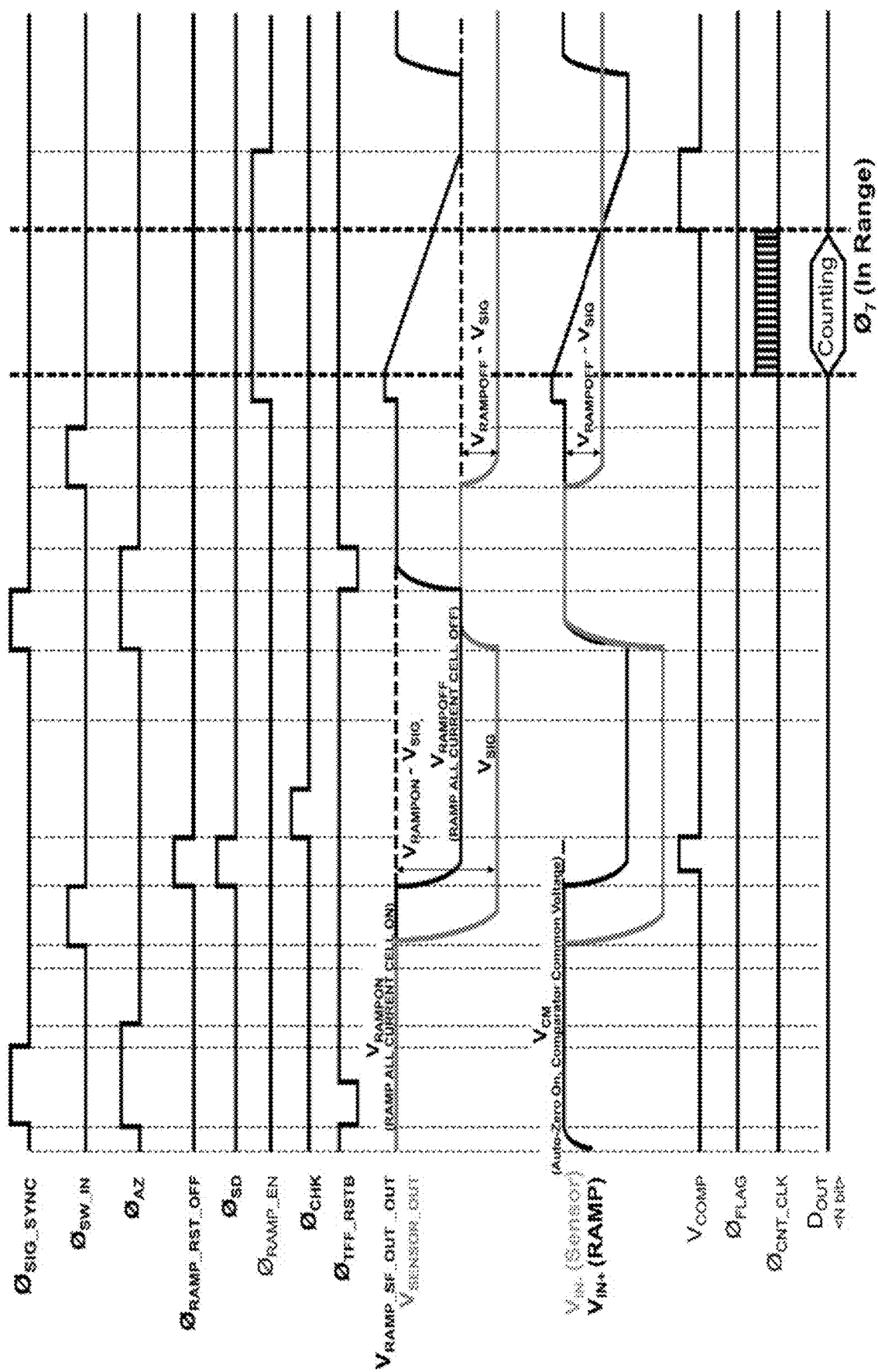

In another example, as shown in FIG. 15, when the sampled input signal $V_{SIG}$ is present outside the predetermined input range, the counter 150 counts as many signals as a difference between the ramp signal $V_{RAMPOFF}$ with the lowest voltage generated by the ramp generator 140 and the input signal $V_{SIG}$ received from the sensor.

The reason for this is that, when the sampled input signal $V_{SIG}$ is present outside the predetermined input range, the state of the ramp generator 140 maintains the off state and the ramp signal $V_{RAMPOFF}$ indicating the off state is output, and the state of the auto zero switch $\emptyset_{AZ}$ is switched to the on state at the corresponding point of time. Therefore, an input at the negative (−) terminal of the comparator 120 varies as much as the difference between the ramp signal $V_{RAMPOFF}$ and the input signal $V_{SIG}$.

In accordance with the present disclosure as described above, a single slope ADC and an operating method thereof have advantages in that a range of an input signal can be twice as large and can be applied to actual products with simplified logic.

In addition, in accordance with the present disclosure, the single slope ADC and the operating method thereof have advantage capable of being easily applied to a structure used in a commercial product without any significant changes and being used as a basic operation type structure used in the existing commercial product, as necessary.

Although the present disclosure is described with reference to few exemplary embodiments and the accompanying drawings, the present disclosure is not limited to the above embodiments, and various modifications and variations can be made by those skilled in the art from the above description. Accordingly, the spirit of the present disclosure should be determined by only the appended claims, and all equivalents or equivalent variations thereof will fall within the spirit and scope of the present disclosure.

What is claimed is:

1. A method of operating a single slope analog-to-digital converter (ADC), the method comprising:
receiving an input signal from a sensor or a ramp signal from a ramp generator according to a state of a switch and sampling the received input or ramp signal;
determining, by a comparator, whether the sampled ramp signal is present in a predetermined input range in a state in which the ramp generator maintains an off state and outputting a determination result;
generating, by a logic part, a flag signal indicating a high or low according to the determination result by the comparator and providing the flag signal to the ramp generator; and
sampling, by the ramp generator, a reference voltage of the comparator according to the flag signal based on an off or on state.

2. The method of claim 1, wherein the generating of, by the logic part, the flag signal indicating the high or low according to the determination result by the comparator and the providing of the flag signal to the ramp generator includes generating a flag signal indicating a high and providing the flag signal to the ramp generator when the sampled ramp signal is present in the predetermined input range on the basis of the determination result by the comparator.

3. The method of claim 2, wherein sampling, by the ramp generator, a reference voltage of the comparator according to the flag signal based on an off or on state includes maintaining the ramp generator in the on state when the flag signal indicates the high.

4. The method of claim 2, wherein sampling, by the ramp generator, a reference voltage of the comparator according to the flag signal based on an off or on state includes maintaining the ramp generator in the off state when the flag signal indicates the low.

5. The method of claim 1, wherein the generating of, by the logic part, the flag signal indicating the high or low according to the determination result by the comparator and the providing of the flag signal to the ramp generator includes generating a flag signal indicating a low and providing the flag signal to the ramp generator when the sampled ramp signal is present outside the predetermined input range on the basis of the determination result by the comparator.

6. A single slope analog-to-digital converter (ADC) comprising:
a switch configured to provide a path for receiving an input signal from a sensor and a path for receiving a ramp signal from a ramp generator;
a comparator configured to receive a sampled input signal or a sampled ramp signal according to a state of the switch, determine whether the sampled input signal is present in a predetermined input range in a state in which the ramp generator maintains an off state, and output a determination result;
a logic part configured to generate a flag signal indicating a high or low according to the determination result by the comparator; and
a ramp generator which maintains an off or on state according to the flag signal received from the logic part.

7. The single slope ADC of claim 6, wherein the logic part generates a flag signal indicating a high and provides the flag signal to the ramp generator when the sampled ramp signal is present in the predetermined input range on the basis of the determination result by the comparator.

8. The single slope ADC of claim 7, wherein the ramp generator maintains the on state when the flag signal indicates the high.

9. The single slope ADC of claim 6, wherein the logic part generates a flag signal indicating a low and provides the flag signal to the ramp generator when the sampled ramp signal is present outside the predetermined input range on the basis of the determination result by the comparator.

10. The single slope ADC of claim 9, wherein the ramp generator maintains the off state when the flag signal indicates the low.

* * * * *